US006833030B2

(12) United States Patent
Kim et al.

(10) Patent No.: US 6,833,030 B2
(45) Date of Patent: Dec. 21, 2004

(54) LIQUID DELIVERY SYSTEM HAVING SAFE UNIT AND OPERATING METHOD THEREOF

(75) Inventors: Myung-Kyu Kim, Gyeonggi-do (KR); Hyun-Ho Lee, Gyeonggi-do (KR)

(73) Assignee: Jusung Engineering Co., Ltd., Gyeonggi-Do (KR)

( * ) Notice: Subject to any disclaimer, the term of this patent is extended or adjusted under 35 U.S.C. 154(b) by 159 days.

(21) Appl. No.: 10/337,145

(22) Filed: Jan. 6, 2003

(65) Prior Publication Data

US 2003/0127052 A1 Jul. 10, 2003

(30) Foreign Application Priority Data

Jan. 7, 2002 (KR) .................................. 10-2002-0000779

(51) Int. Cl.[7] .......................... C23C 16/00; C23F 1/00; H01L 21/306
(52) U.S. Cl. ...................... 118/715; 118/663; 118/696; 118/707; 118/710; 118/712; 156/345.24; 156/345.28; 156/345.29
(58) Field of Search ................................ 118/663, 696, 118/707, 710, 712, 715; 156/345.15, 345.24, 345.28, 345.29

(56) References Cited

U.S. PATENT DOCUMENTS

| | | | | |
|---|---|---|---|---|
| 5,027,661 A | * | 7/1991 | Desaulniers et al. | 73/861 |
| 5,182,704 A | * | 1/1993 | Bengtsson | 700/52 |
| 5,342,580 A | * | 8/1994 | Brenner | 422/92 |
| 5,443,642 A | * | 8/1995 | Bienduga | 118/688 |
| 5,690,743 A | * | 11/1997 | Murakami et al. | 118/715 |
| 5,826,607 A | * | 10/1998 | Knutson et al. | 137/1 |
| 5,873,388 A | * | 2/1999 | Carpenter | 137/624.15 |
| 5,954,911 A | * | 9/1999 | Bergman et al. | 156/345.29 |
| 6,254,720 B1 | * | 7/2001 | Shih | 156/345.15 |
| 6,758,911 B2 | * | 7/2004 | Campbell et al. | 118/715 |
| 2002/0119706 A1 | * | 8/2002 | Sagues et al. | 439/638 |
| 2003/0127052 A1 | * | 7/2003 | Kim et al. | 118/715 |

* cited by examiner

Primary Examiner—Jeffrie R. Lund
(74) Attorney, Agent, or Firm—Kevin R. Erdman; Baker & Daniels

(57) ABSTRACT

A liquid delivery system having safe unit includes: an injection valve connected to a chamber; a mass flow controller connected to the injection valve; an auxiliary valve connected between the injection valve and the mass flow controller; an auxiliary pump connected to the auxiliary valve; and a relay electrically connected to the auxiliary valve.

8 Claims, 2 Drawing Sheets

LIQUID DELIVERY SYSTEM HAVING SAFE UNIT AND OPERATING METHOD THEREOF

This application claims the benefit of Korean Patent Application No. 2002-779, filed on Jan. 7, 2002 in Korea, which is hereby incorporated by reference for all purposes as if fully set forth herein.

BACKGROUND OF THE INVENTION

1. Field of the Invention

The present invention relates to a liquid delivery system and more particularly, to a liquid delivery system having a safe unit that prevents a contamination of the liquid delivery system due to an inflow of ambient air when a power abruptly stops being supplied.

2. Discussion of the Related Art

Recently, various deposition methods of semiconductor devices, for example, a physical vapor deposition (PVD) method or a chemical vapor deposition (CVD) method, are suggested according to a high integration and a high performance of semiconductor devices. Since characteristics of a thin film by the CVD method are largely dependent on a structure and a capability of a liquid delivery system, makers of semiconductor devices develop and use their own liquid delivery system.

FIG. 1 is a schematic view showing a structure of a related art chemical vapor deposition apparatus including a liquid delivery system. As shown in FIG. 1, a wafer "W" is loaded on a susceptor 40 by a robot arm (not shown) through an open portion (not shown) of a process chamber 20 from a load lock chamber (not shown) when a slit valve (not shown) is open. After the robot arm is taken out from the process chamber 20, the slit valve is closed and a main valve 52 is open. Thus, the process chamber 20 obtains a high vacuum state through a continuous pumping procedure of a main pump 50. When the high vacuum state is maintained in the process chamber 20, a liquid source material controlled by a mass flow controller (MFC) 14 and a delivery gas delivering the liquid source material are combined in a liquid delivery system 10 and injected onto the wafer "W" from a nozzle 30 at an upper portion of the process chamber 20 through an injection valve 12. When a depositing process is completed, the wafer "W" is taken out from the process chamber 20 by the robot arm. Even though the injection valve 12 is closed because no more liquid source materials are necessary, the mass flow controller 14 is continuously operated to keep a uniform flow of the liquid source material. Accordingly, the liquid source material flows out through an auxiliary valve 15 and an auxiliary pump 16.

When the injection valve 12 is open, the auxiliary valve 15 is closed and the liquid source material and the delivery gas flow only into the process chamber 20. Since the injection valve 12 is closed when a depositing process is completed, the auxiliary valve 15 is open and the liquid source material and the delivery gas are exhausted by the auxiliary pump 16, thereby a subsequent process prepared.

In the liquid delivery system, if an electric power stops being supplied during a preparation of a subsequent process, an exterior air can be reversely injected into and contaminate the liquid delivery system. To prevent this back stream and the contamination, the auxiliary valve 15 should be closed when the electric power stops being supplied.

FIG. 2 is a schematic diagram illustrating an operation of a related art safe unit of a liquid delivery system. As shown in FIG. 2, when a power stops being supplied due to an electricity failure, a first signal "S1" of stop of an auxiliary pump 16 (of FIG. 1) is applied to a Programmable Logic Controller (PLC). The PLC performs an interlock check and receives a second signal "S2" as a result of the check. The PLC analyzes the second signal "S2" and generates a third signal "S3" of closing an auxiliary valve 15 (of FIG. 1). The auxiliary valve 15 (of FIG. 1) is closed according to the third signal "S3" so that a contamination of a liquid delivery system due to a back stream can be prevented.

However, since the related art safe unit of a liquid delivery system performs the interlock check by a software method, it takes about 4 to about 6 seconds to generate the third signal "S3" and close the auxiliary valve 15 (of FIG. 1) according to the result of the check by a software method. The delay time of about 4 to about 6 seconds for the interlock check and the closing the auxiliary valve 15 (of FIG. 1) means that a lot of ambient air have been already injected into the liquid delivery system and the liquid delivery system is contaminated. Accordingly, the process should be stopped to replace the contaminated apparatus and this decrease the throughput. Moreover, the expense for replacement raises the production cost. When the auxiliary pump 16 (of FIG. 1) is out of order, the same problem occurs.

SUMMARY OF THE INVENTION

Accordingly, the present invention is directed to a safe unit of a liquid delivery system that substantially obviates one or more of problems due to limitations and disadvantages of the related art.

An object of the present invention is to provide a liquid delivery system having a safe unit that prevents a contamination due to a back stream of exterior ambient air by using an element of hardware.

Another object of the present invention is to provide a liquid delivery system having a safe unit that has a simple structure and a low cost of maintenance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid delivery system having safe unit includes: an injection valve connected to a chamber; a mass flow controller connected to the injection valve; an auxiliary valve connected between the injection valve and the mass flow controller; an auxiliary pump connected to the auxiliary valve; and a relay electrically connected to the auxiliary valve.

The mass flow controller adjusts a mass of a liquid source material and supplies the liquid source material into the chamber through the injection valve during a process in the chamber. A delivery gas is further supplied into the chamber through the injection valve with the liquid source material during a process in the chamber. The liquid source material is exhausted through the auxiliary valve by the auxiliary pump after the process in the chamber. The auxiliary valve is closed according to a first signal of the relay when the auxiliary pump is stopped.

The liquid delivery system further comprises a programmable logic controller electrically connected to the auxiliary pump and the relay. A second signal of stop of the auxiliary pump is applied to the programmable logic controller when the auxiliary pump is stopped and a third signal of operating the relay is generated at the programmable logic controller due to the second signal and applied to the relay.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
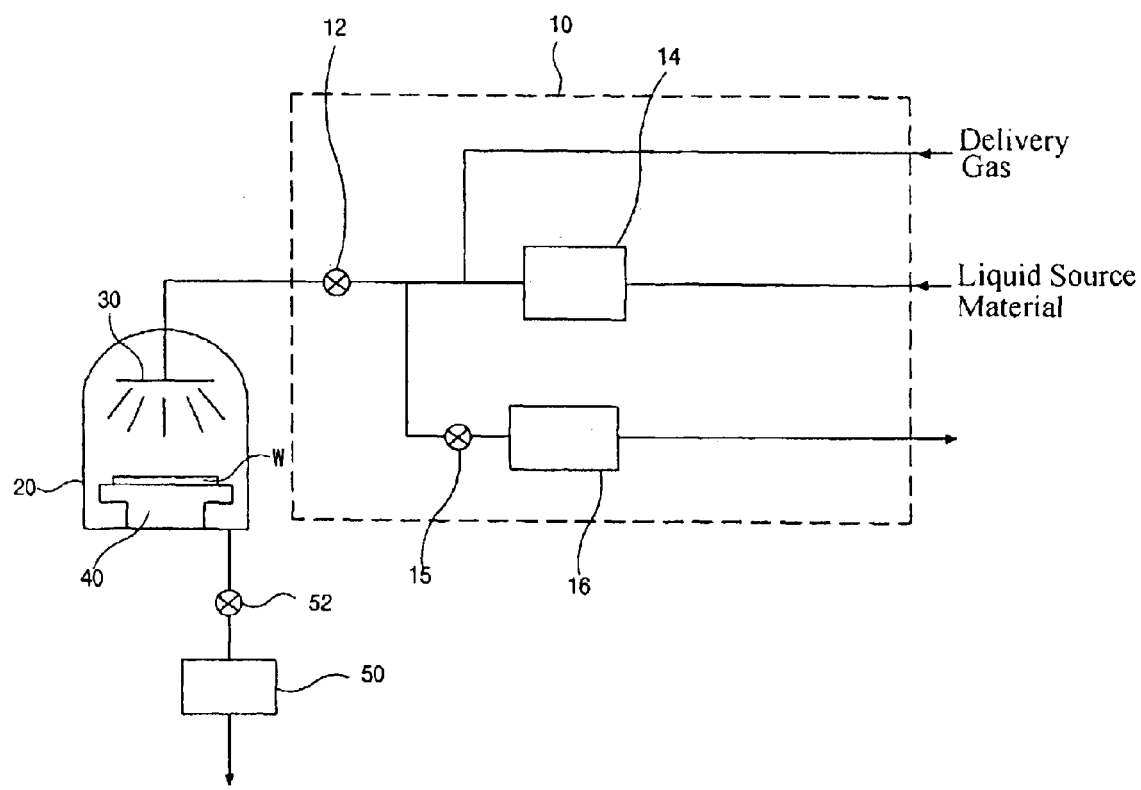
FIG. 1 is a schematic view showing a structure of a related art chemical vapor deposition apparatus including a liquid delivery system.
Figure 2:
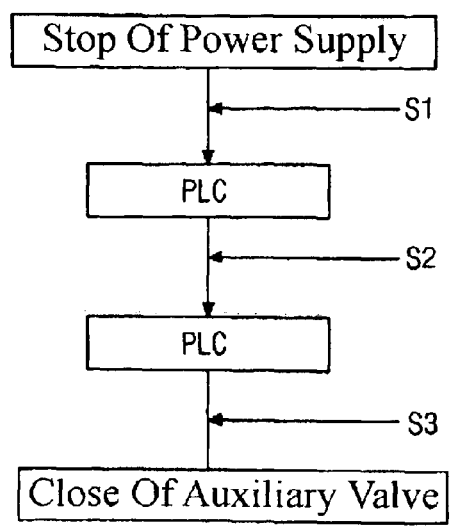
FIG. 2 is a schematic diagram illustrating an operation of a related art safe unit of a liquid delivery system.
Figure 3:
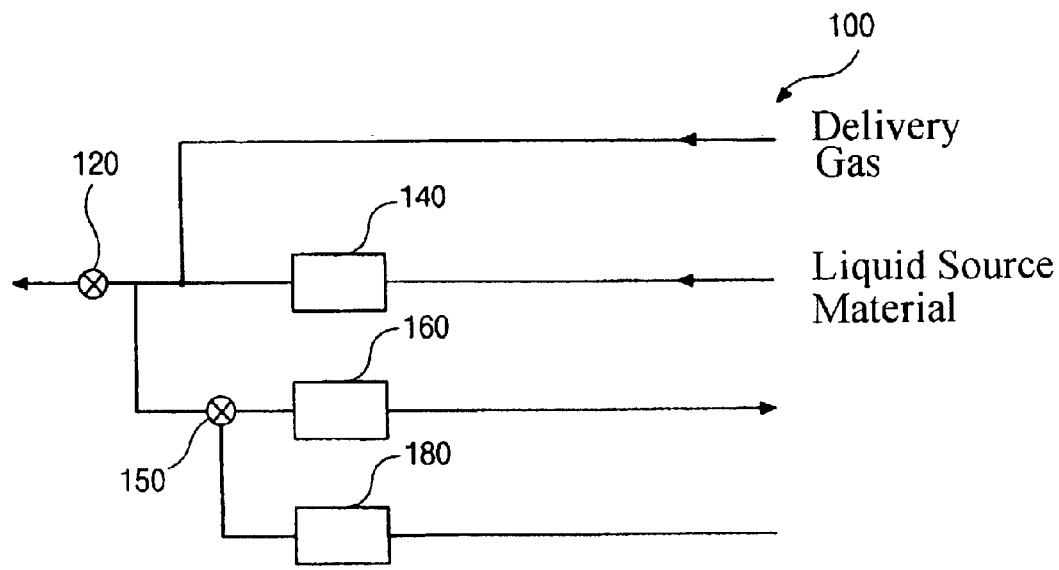
FIG. 3 is a schematic view showing a liquid delivery system according to an embodiment of the present invention.

FIG. 3 is a schematic view showing a liquid delivery system according to an embodiment of the present invention. As shown in FIG. 3, the liquid delivery system includes an injection valve 120, a mass flow controller (MFC) 140, an auxiliary valve 150, an auxiliary pump 160 and a relay 180. A liquid source material adjusted by the MFC 140 and a delivery gas containing the liquid source material are injected into a process chamber (not shown) through the injection valve. The liquid source material adjusted by the MFC 140 and the delivery gas containing the liquid source material are exhausted through the auxiliary valve 150 and the auxiliary pump 160 when the injection valve 120 is closed. The relay 180 is electrically connected to the auxiliary valve 150 and closes the auxiliary valve 150 in an emergency.

In a normal state, the injection valve 120 is open and the auxiliary valve 150 is closed during a process performed in the process chamber (not shown). Accordingly, the liquid source material and the delivery gas are continuously injected into the process chamber (not shown) through the injection valve 120. After the process, the injection valve 120 is closed and the auxiliary valve 150 is open. Accordingly, the liquid source material and the delivery gas are exhausted through the auxiliary valve 150 by the auxiliary pump 160.

Figure 4:
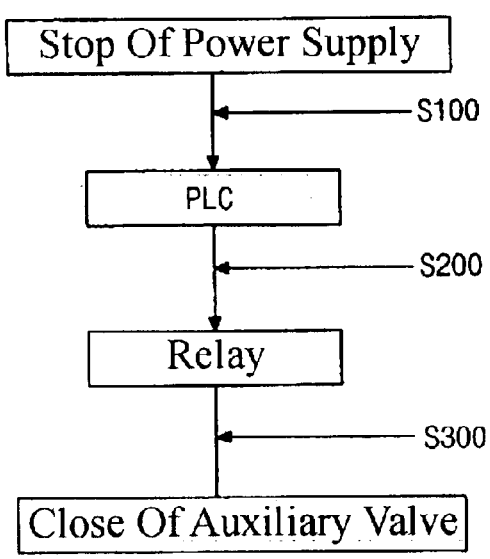
FIG. 4 is a schematic diagram illustrating an operation of a safe unit of a liquid delivery system according to an embodiment of the present invention.

FIG. 4 is a schematic diagram illustrating an operation of a safe unit of a liquid delivery system according to an embodiment of the present invention.

After a process is ended in a process chamber, an injection valve 120 (of FIG. 3) is closed and an auxiliary pump 160 (of FIG. 3) exhausts a liquid source material and a delivery gas through an open auxiliary valve 150 (of FIG. 3).

When the auxiliary pump 160 (of FIG. 3) stops due to an electricity failure, a first signal "S100" of stop of the auxiliary pump 160 (of FIG. 3) is detected by a programmable logic controller (PLC). The PLC generates a second signal "S200" of operating a relay 180 (of FIG. 3) according to the first signal "S100" and transfers the second signal "S200" to the relay 180 (of FIG. 3). The relay 180 (of FIG. 3) immediately generates and transfers a third signal "S300" of closing the auxiliary valve 150 (of FIG. 3). Accordingly, the auxiliary valve 150 (of FIG. 3) is instantly closed so that an inflow of exterior ambient air can be prevented.

The relay 180 (of FIG. 3) has a simple structure that a magnetic field is generated when a current is applied to an inner electromagnet and a contact point is switched on/off according to the generated magnetic field. Therefore, the relay 180 (of FIG. 3) can immediately react to the second signal "S200" and generate the third signal "S300."

Since the auxiliary valve 150 (of FIG. 3) is closed by a hardware method using the relay 180 (of FIG. 3), a delay time for an interlock check of the PLC by a software method is not necessary. Accordingly, it takes just about 0.5 to about 1 second to close the auxiliary valve 150 (of FIG. 3) after stop of the auxiliary pump 160 (of FIG. 3) and a contamination of the liquid delivery system due to an inflow of exterior ambient air is completely prevented.

Even when the auxiliary pump 160 (of FIG. 3) suddenly stops operating due to the other reasons, the relay 180 (of FIG. 3) immediately generates a signal and the auxiliary valve 150 (of FIG. 3) is instantly closed according to the signal. Therefore, a contamination of the liquid delivery system due to an inflow of exterior ambient air is also completely prevented.

In the present invention, when an auxiliary pump suddenly stops operating with an auxiliary valve open, a contamination of the liquid delivery system due to an inflow of exterior ambient air is completely prevented by instant close of the auxiliary valve using a relay. Accordingly, an interruption of a process and a generation of an additional cost due to a replacement of a contaminated system is also prevented, and a high throughput and a low cost is obtained.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A liquid delivery system having safe unit, comprising:

an injection valve connected to a chamber;

a mass flow controller connected to the injection valve;

an auxiliary valve connected between the injection valve and the mass flow controller;

an auxiliary pump connected to the auxiliary valve; and a relay electrically connected to the auxiliary valve.

2. The system according to claim 1, wherein the mass flow controller adjusts a mass of a liquid source material and supplies the liquid source material into the chamber through the injection valve during a process in the chamber.

3. The system according to claim 2, wherein a delivery gas is further supplied into the chamber through the injection valve with the liquid source material during a process in the chamber.

4. The system according to claim 3, wherein the liquid source material is exhausted through the auxiliary valve by the auxiliary pump after the process in the chamber.

5. The system according to claim 4, wherein the auxiliary valve is closed according to a first signal of the relay when the auxiliary pump is stopped.

6. The system according to claim 5, further comprising a programmable logic controller electrically connected to the auxiliary pump and the relay.

7. The system according to claim 6, wherein a second signal of stop of the auxiliary pump is applied to the programmable logic controller when the auxiliary pump is stopped.

8. The system according to claim 7, wherein a third signal of operating the relay is generated at the programmable logic controller due to the second signal and applied to the relay.

* * * * *